United States Patent
Lee

(10) Patent No.: US 7,526,009 B2
(45) Date of Patent: Apr. 28, 2009

(54) END-PUMPED VERTICAL EXTERNAL CAVITY SURFACE EMITTING LASER

(75) Inventor: Jun-ho Lee, Seongnam-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 21 days.

(21) Appl. No.: 11/399,391

(22) Filed: Apr. 7, 2006

(65) Prior Publication Data

US 2006/0251140 A1 Nov. 9, 2006

(30) Foreign Application Priority Data

| May 7, 2005 | (KR) | .................. 10-2005-0038201 |
| Jul. 29, 2005 | (KR) | .................. 10-2005-0069676 |
| Dec. 29, 2005 | (KR) | .................. 10-2005-0133172 |

(51) Int. Cl.
*H01S 3/091* (2006.01)

(52) U.S. Cl. ............... 372/70; 372/34; 372/36; 372/69; 372/99

(58) Field of Classification Search ............ 372/23, 372/69, 71, 72, 34, 36, 70, 99
See application file for complete search history.

(56) References Cited

U.S. PATENT DOCUMENTS

| 4,083,018 | A | * | 4/1978 | Yang et al. .................. 372/41 |
| 5,436,920 | A | | 7/1995 | Minemoto et al. |
| 5,517,157 | A | * | 5/1996 | English .................. 331/94.1 |
| 5,627,853 | A | | 5/1997 | Mooradian et al. |
| 5,724,375 | A | * | 3/1998 | Peters .................. 372/46.01 |
| 5,837,561 | A | * | 11/1998 | Kish et al. .................. 438/47 |
| 5,956,362 | A | * | 9/1999 | Yokogawa et al. ....... 372/46.01 |

(Continued)

FOREIGN PATENT DOCUMENTS

WO    2005/098573 A1    10/2005

OTHER PUBLICATIONS

Alan J. Kemp et al ("Thermal Management in Vertical-External-Cavity Surface-Emitting Lasers: Finite-Element Analysis of a Heatspreader Approach", IEEE Journal of Quantum Electronics, vol. 41, No. 2, Feb. 2005).*

(Continued)

*Primary Examiner*—Minsun Harvey
*Assistant Examiner*—Yuanda Zhang
(74) *Attorney, Agent, or Firm*—Buchanan Ingersoll & Rooney PC

(57) ABSTRACT

There is provided an end-pumped vertical external cavity surface emitting laser (VECSEL) in which a pump laser beam is incident on a laser chip at a right angle. In the external cavity surface emitting laser, a laser chip package is provided with a laser chip emitting light at a first wavelength by optical pumping, an external mirror is spaced apart from a top surface of the laser chip package to transmit a portion of the light emitted from the laser chip to the outside and to reflect the remainder to the laser chip, a heat sink is coupled to the bottom surface of the laser chip package to discharge heat generated by the laser chip, and a pump laser faces a bottom surface of the heat sink to emit pump light at a second wavelength perpendicular to the laser chip.

25 Claims, 12 Drawing Sheets
(1 of 12 Drawing Sheet(s) Filed in Color)

U.S. PATENT DOCUMENTS

| | | | |
|---|---|---|---|
| 6,057,560 A * | 5/2000 | Uchida | 257/94 |
| 6,339,496 B1 * | 1/2002 | Koley et al. | 359/344 |
| 6,593,159 B1 * | 7/2003 | Hashimoto et al. | 438/22 |
| 6,594,297 B1 | 7/2003 | Hayakawa | |
| 6,693,941 B1 | 2/2004 | Okazaki et al. | |
| 6,822,988 B1 | 11/2004 | Okazaki et al. | |
| 6,888,871 B1 * | 5/2005 | Zhang et al. | 372/75 |
| 7,012,943 B2 * | 3/2006 | Tran et al. | 372/50.1 |
| 2003/0178553 A1 * | 9/2003 | Simon | 250/216 |
| 2005/0247950 A1 * | 11/2005 | Nakamura et al. | 257/98 |
| 2005/0281308 A1 * | 12/2005 | Kim | 372/70 |
| 2006/0029112 A1 * | 2/2006 | Young et al. | 372/7 |

OTHER PUBLICATIONS

Kim, Taek, et al., *"End-Pumped Vertical External Cavity Surface Emitting Laser"*, Proc. of SPIE, 2006, 61320D1-61320D-5, vol. 6132, SPIE Publishing Sevices, Bellingham, WA.

\* cited by examiner

END-PUMPED VERTICAL EXTERNAL CAVITY SURFACE EMITTING LASER

CROSS-REFERENCE TO RELATED PATENT APPLICATION

This application claims the benefit of Korean Patent Application No. 10-2005-0038201, filed on May 7, 2005, No. 10-2005-0069676, filed on Jul. 29, 2005, and No. 10-2005-0133172, filed on Dec. 29, 2005, in the Korean Intellectual Property Office, the disclosures of which are incorporated herein in their entirety by reference.

BACKGROUND OF THE DISCLOSURE

1. Field of the Disclosure

The present disclosure relates to a surface emitting laser, and more particularly, to an end-pumped vertical external cavity surface emitting laser (VECSEL) in which a pump laser beam is incident on a laser chip at a right angle.

2. Description of the Related Art

Among semiconductor lasers, an edge emitting laser emits a laser beam parallel to a substrate, and a surface emitting laser or vertical cavity surface emitting laser (VCSEL) emits a laser beam perpendicular to a substrate. The VCSEL has a high coupling efficiency because it can oscillate at a single longitudinal mode of a narrow spectrum and also it has a small emission angle. Further, the VCSEL can be easily integrated into other devices due to its structure. However, it is more difficult for the VCSEL than for the edge emitting laser to oscillate at a single traverse mode. The VCSEL requires a narrow oscillation region for single traverse mode operation, causing a low emission power.

To retain the advantages of the VCSEL while adding high emission power, a vertical external cavity surface emitting laser (VECSEL) has been developed. The VECSEL has a gain region that is increased by replacing an upper mirror with an external mirror so that the VECSEL can obtain a high emission power of tens of watts or more.

FIG. 1 is a schematic sectional view of an optical pumping type VECSEL according to the related art. Referring to FIG. 1, an optical pumped VECSEL 10 includes a laser chip 12, a heat sink 11 on which the laser chip 12 is attached, and an external mirror 13 spaced apart from the laser chip 12. The VECSEL 10 further includes a pump laser 15 aligned at an angle to provide a pump laser beam to the laser chip 12. Though not shown, the laser chip 12 includes a distributed Bragg reflector (DBR) and an active layer stacked sequentially on a substrate. As known to those of ordinary skill in the art, the active layer, for example, has a multi quantum well structure with a resonant periodic gain (RPG) structure and is excited by a pump laser beam to generate light at a predetermined wavelength. The heat sink 11 cools the laser chip 12 by dissipating heat generated by the laser chip 12. The pump laser 15 irradiates light (having a shorter wavelength than the light emitted from the laser chip 12) to the laser chip 12 through a lens array 16 in order to activate the active layer of the laser chip 12.

In this structure, when light emitted from the pump laser 15 at a relatively short wavelength is incident on the laser chip 12 through the lens array 16, the active layer of the laser chip 12 is activated to generate light at a specific wavelength. The light generated by the active layer is repeatedly reflected between the DBR layer of the laser chip 12 and the external mirror 13 through the active layer. Therefore, a resonance cavity of the VECSEL 10 is defined between the DBR layer of the laser chip 12 and a concave surface of the external mirror 13. Through this repeated reflection, the light is amplified in the laser chip 12. A portion of the amplified light is output to the outside as a laser beam through the external mirror 13, and the remainder of the light is reflected again to the laser chip 12 as pump light. A second harmonic generation (SHG) crystal 14 can be located between the laser chip 12 and the external mirror 13 to double the frequency of the light. If the SHG crystal 14 is used, for example, a laser beam having a visible wavelength can be output from infrared light emitted from the laser chip 12.

In the VECSEL 10 with this structure, however, the pump laser 15 that activates the laser chip 12 does not share a common axis with the other components, but must be offset from and at an angle to the axis. This increases the complexity and time of the manufacturing process, thereby rendering mass-production of the VECSEL difficult, and also limits the potential size reduction of the VECSEL. Further, the pump laser beam emitted from the pump laser 15 is incident on the laser chip 12 at about 45 degrees, thereby causing significant reflection loss and a drop in oscillation efficiency. In addition, since the pump laser beam has an elliptical shape on the laser chip 12 due to the incident angle, light generated by the laser chip 12 in response to the pump laser beam has an elliptical cross-section instead of a circular cross-section.

Further, since the wavelength converting efficiency of the SHG crystal 14 increases in proportion to incident light energy, it is preferable that the SHG crystal 14 is positioned close to the laser chip 12. However, this is not possible because the pump laser beam of the pump laser 15 is incident on the laser chip 12 from the front of the laser chip 12. Therefore, the efficiency of the SHG crystal 14 decreases.

SUMMARY OF THE DISCLOSURE

The present invention may provide a VECSEL that can be mass produced through a simple manufacturing process and can be reduced in size.

The present invention also may provide an end-pumped VECSEL that has a high efficiency without reflection loss by emitting a pump laser beam onto a laser chip at a right angle.

The present invention further may provide a VECSEL that has an efficient heat discharging structure to maintain high efficiency.

According to an aspect of the present invention, there may be provided a vertical external cavity surface emitting laser including: a laser chip package provided with a laser chip emitting light at a first wavelength by optical pumping; an external mirror spaced apart from a top surface of the laser chip package to transmit a portion of the light emitted from the laser chip to the outside and to reflect the remainder to the laser chip; a heat sink coupled to a bottom surface of the laser chip package to dissipate heat generated by the laser chip; and a pump laser facing a bottom surface of the heat sink to emit pump light at a second wavelength perpendicular to the laser chip.

The heat sink may have a central opening to allow the pump light emitted from the pump laser to reach the laser chip package.

The laser chip package may include: a thermal conductive and transparent submount located on a top surface of the heat sink; and the laser chip attached to a top surface of the submount at a center portion to emit the first wavelength light to the external mirror, wherein the submount transfers the heat generated by the laser chip to the heat sink and transmits the pump light emitted from the pump laser.

The submount may be formed of at least one material selected from the group consisting of diamond, silicon carbide (SiC), aluminum nitride (AlN), and gallium nitride (GaN).

The laser chip and the submount may be coupled by capillary bonding. In this case, the laser chip may be more firmly fixed to the submount by applying a curable resin around the top surface of the submount where the laser chip is attached and around an outer surface of the laser chip, and hardening the curable resin.

The laser chip may include: a substrate; an active layer having a quantum well structure formed on the substrate, the active layer being activated by the pump light emitted from the pump laser to emit the first wavelength light; and a DBR layer formed on the active layer to reflect the first wavelength light emitted from the active layer to the external mirror and to transmit the second wavelength pump light emitted from the pump laser.

The substrate of the laser chip may face the external mirror and the DBR layer of the laser chip may contact the top surface of the submount.

The substrate may have a central opening to allow the light emitted from the active layer of the laser chip to advance to the external mirror.

The laser chip package may further include first and second package blocks attached respectively between the heat sink and the submount and to a top surface of the laser chip, to protect the laser chip and dissipate the heat generated by the laser chip. The first and second package blocks may each have a central opening, to respectively allow the first wavelength light emitted from the laser chip to advance to the external mirror and allow the second wave length light emitted from the pump laser to reach the laser chip.

Alternatively, the laser chip package may further include a package block partially enclosing a lateral surface and a top edge of the submount and fixed to the heat sink to fix the laser chip package to the heat sink and discharge heat generated by the laser chip.

The external cavity surface emitting laser may further include an SHG crystal between the laser chip package and the external mirror to double the frequency of the first wavelength light emitted from the laser chip package. The SHG crystal may contact the laser chip package or the laser chip directly.

Alternatively, the laser chip package may include: a thermal conductive and transparent submount facing a top surface of the heat sink; and the laser chip attached to a bottom surface of the submount at a center portion to emit the first wavelength light to the external mirror, wherein the submount transfers the heat generated by the laser chip to the heat sink and transmits the first wavelength light emitted from the laser chip.

The laser chip may include: a substrate; a DBR layer formed on the substrate; and an active layer having a quantum well structure and formed on the DBR layer, the active layer being activated by the pump light emitted from the pump laser to emit the first wavelength light, wherein the DBR reflects the first wavelength light emitted from the active layer to the external mirror and transmits the second wavelength pump light emitted from the pump laser.

The substrate of the laser chip may face the heat sink and the active layer of the laser chip may contact the bottom surface of the submount.

The laser chip package may further include a package block partially enclosing a top edge and a bottom edge of the submount and fixed to the heat sink to fix the submount.

BRIEF DESCRIPTION OF THE DRAWINGS

The patent or application file contains at least one drawing executed in color. Copies of this patent or patent application publication with color drawing(s) will be provided by the Office upon request and payment of the necessary fees.

The above and other features and advantages of the present invention are described in detailed exemplary embodiments thereof with reference to the attached drawings in which.

DETAILED DESCRIPTION OF EXEMPLARY EMBODIMENTS

Figure 2:
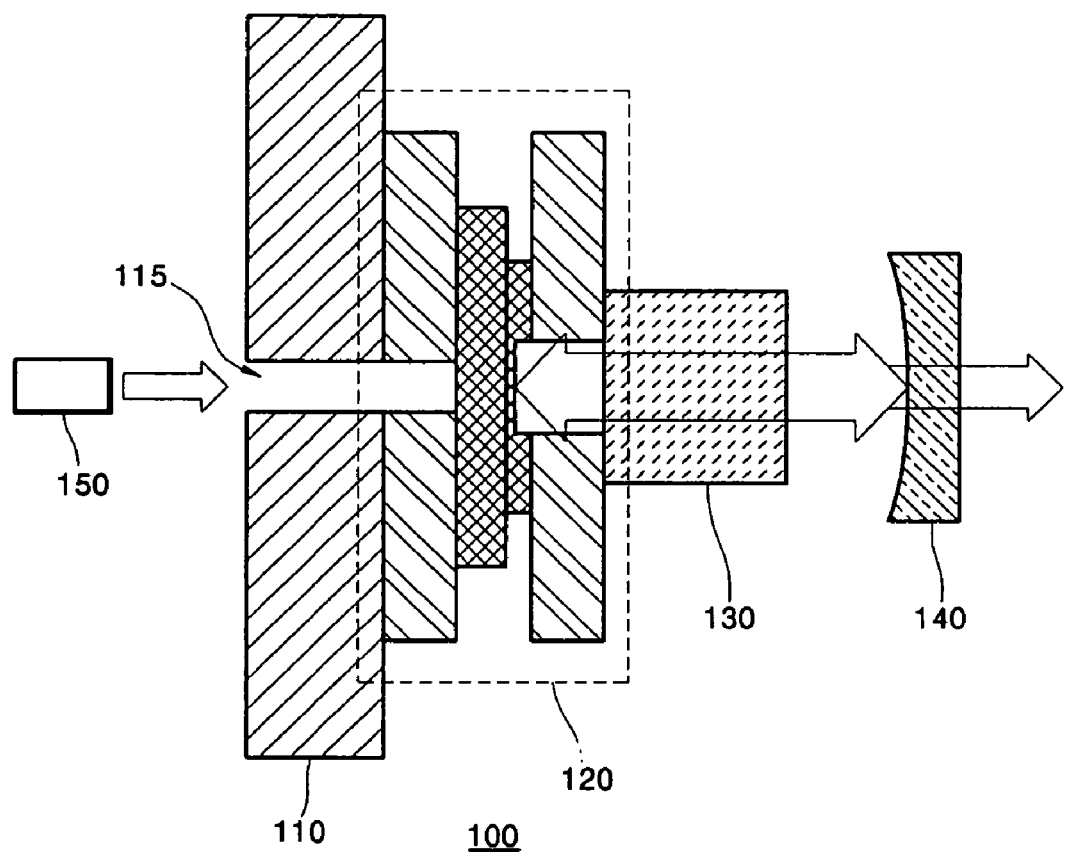
FIG. 2 is a sectional view of an end-pumped VECSEL according to a first embodiment of the present invention.

FIG. 2 is a sectional view of an end-pumped VECSEL according to a first embodiment of the present invention.

Referring to FIG. 2, a VECSEL 100 according to the first embodiment of the present invention includes a laser chip package 120 having a gain structure to emit light at a first wavelength, an external mirror 140 spaced apart from one side of the laser chip package 120, and a pump laser 150 emitting pump light at a second wavelength to the other side of the laser chip package 120. As described above, the external mirror 140 outputs a laser beam by transmitting a portion of the first wavelength light emitted from the laser chip package 120 to the outside, and reflects the remainder of the first wavelength light back to the laser chip package 120 for amplification. Here, the second wavelength pump light emitted from pump laser 150 has a shorter wavelength than the first wavelength light emitted from the laser chip package 120. For example, when a Ga-based semiconductor is used, the laser chip package 120 emits infrared light having a wavelength range of about 900 nm to 1100 nm. In this case, it is suitable that the pump laser 150 emits pump light at a wavelength of about 808 nm.

Meanwhile, as shown in FIG. 2, a heat sink 110 may be additionally attached to the other side of the laser chip package 120 to dissipate heat from the laser chip package 120 during operation. Generally, the light transmittance of the heat sink 110 is not good. Therefore, the heat sink 110 may define an opening 115 to pass pump light from the pump laser 150 through to the laser chip package 120. The heat sink 110 may be formed of a material with a high thermal conductivity, such as copper (Cu).

Further, as shown in FIG. 2, an SHG crystal 130 may be additionally located between the laser chip package 120 and the external mirror 140 to double the frequency of the first wavelength light emitted from the laser chip package 120. If the SHG crystal 130 is used, for example, infrared light emitted from the laser chip package 120 at a wavelength in the range of 900 nm to 1100 nm is converted into visible light having a wavelength in the range of 450 nm to 550 nm. The SHG crystal 130 may be made of potassium titanyl phosphate (KTP), $LiNbO_3$, periodically poled $LiNbO_3$ (PPLN), periodically-poled lithium tantalate (PPLT), KTN, $KnbO_3$, etc. Preferably, the SHG crystal 130 is in contact with the laser chip package 120.

According to this structure of the VECSEL 100, the pump laser 150 is aligned with the laser chip package 120 from the back of the laser chip package 120, unlike the conventional VECSEL having a pump laser located at an angle on one side. That is, the pump laser 150 is arranged on the same axis as the other components. Therefore, the VECSEL 100 of the present invention can be manufactured through a simpler process than the conventional VECSEL, so that the VECSEL 100 can be mass-produced. Further, the size of the VECSEL 100 can be reduced. For example, the VECSEL 100 can be manufactured to have a diameter equal to or less than 20 mm and an overall length equal to or less than 50 mm except for the pump laser 150. Furthermore, since the pump laser beam can be incident on the laser chip package 120 at a right angle, almost no reflection loss occurs and the pump laser beam can be concentrated on the desired area. Therefore, the optical output power of the laser can be increased, and the cross section of the light output from the laser chip package 120 can be maintained in an approximately circular configuration. Further, since the pump laser 150 is not placed at the side, the SHG crystal 130 can be placed close to the laser chip package 120. Therefore, the optical wavelength converting efficiency of the SHG crystal 130 can be increased.

Figure 3:
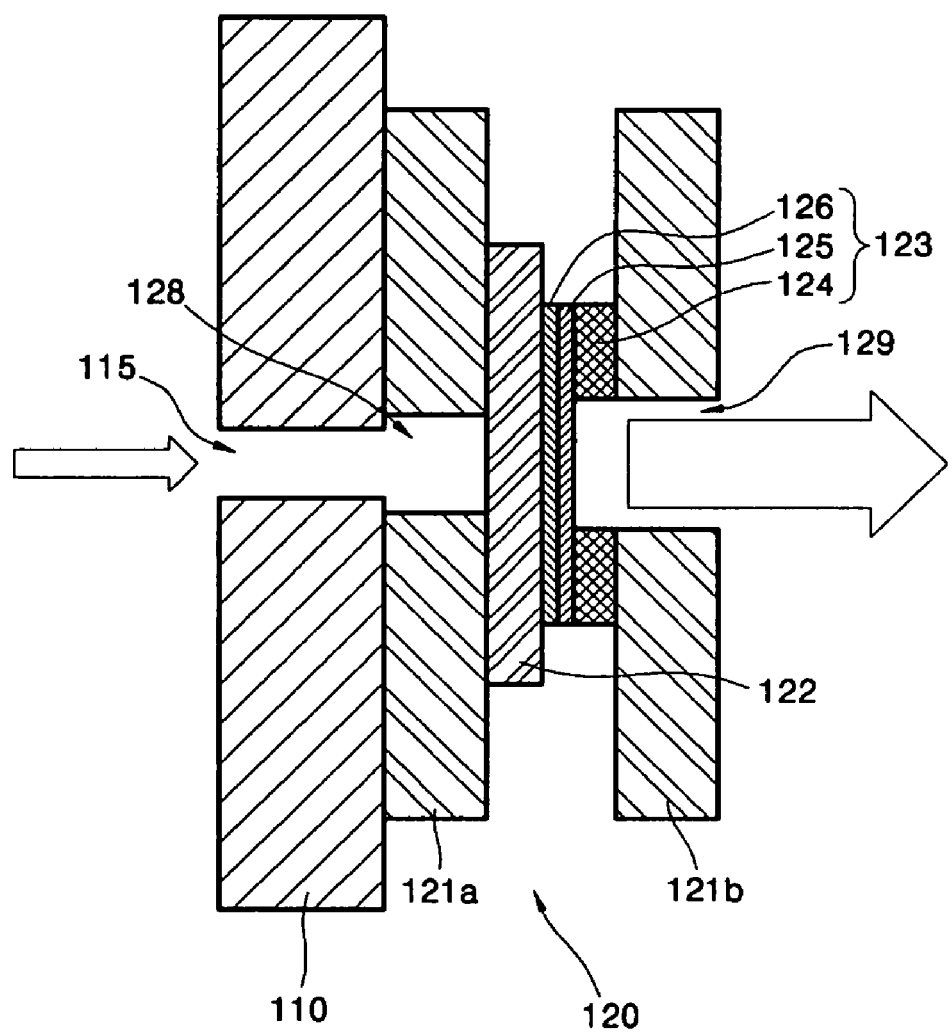
FIG. 3 is a sectional view of a laser chip package of the end-pumped VECSEL depicted in FIG. 2.

The structure of the laser chip package 120 included in the VECSEL 100 of the first embodiment is illustrated more specifically in FIG. 3.

Referring to FIG. 3, the laser chip package 120 of the VECSEL 100 of the first embodiment includes a laser chip 123 emitting light at a first wavelength to the external mirror 140, and a submount 122 coupled to the laser chip 123 to transfer heat from the laser chip 123 to the heat sink 110. According to the structure of the laser chip package 120 illustrated in FIG. 3, the pump laser 150 emits pump light at a second wavelength, which passes through the submount 122 to strike the laser chip 123. Therefore, the submount 122 is designed to have a high thermal conductivity and as well a high optical transmittance for the second wavelength pump light. Preferably, the submount 122 is formed of diamond. Alternatively, the submount 122 can be formed of other materials such as SiC, AlN, and GaN.

Meanwhile, the laser chip 123 is a gain structure formed of a semiconductor emitting the first wavelength light in response to the second wavelength pump light incident from the pump laser 150. As shown in FIG. 3, the laser chip 123 generally includes a substrate 124, an active layer 125 formed on the substrate 124, and a DBR layer 126 formed on the active layer 125. As known to those of ordinary skill in the art, the active layer 125 has a quantum well structure such that the active layer 125 can emit the first wavelength light when activated by the pump light emitted from the pump laser 150. Further, the DBR layer 126 has a multi-layer structure formed by alternating a plurality of high refractive layers with a plurality of low refractive layers, such that the DBR layer 126 can have the maximum reflectance for the first wavelength light emitted from the active layer 125. Here, the DBR layer 126 may be designed to allow the second wavelength light emitted from the pump laser 150 to pass through to the active layer 125. In this structure, the first wavelength light emitted from the active layer 125 is repeatedly reflected between the DBR layer 126 and the external mirror 140 through the active layer 125. This repeated reflection amplifies the first wavelength light in the active layer 125, and then a portion of the first wavelength light is output to the outside as a laser beam through the external mirror 140, and the remainder of the first wavelength light is reflected again to the DBR layer 126. Therefore, the DBR layer 126 and the external mirror 140 carry out the function of a resonator for the first wavelength light.

Since the first wavelength light emitted from the active layer 125 is repeatedly transmitted through the substrate 124 as the first wavelength light and is repeatedly reflected between the DBR layer 126 and the external mirror 140, optical losses can be caused by the substrate 124. To prevent this, the substrate 124 may have a central opening as shown in FIG. 3.

The laser chip 123 is mounted on the submount 122. For example, as shown in FIG. 3, the laser chip 123 is mounted on the submount 122 with the substrate 124 facing the external mirror 140 and the DBR layer 126 contacting the submount 122. According to the laser chip package 120 of the present invention, heat generated by the active layer 125 can be easily dissipated through the submount 122. If the laser chip is mounted on the submount with the substrate contacting the submount after stacking the DBR layer and the active layer on the substrate, the heat dissipating path is lengthened because the heat generated by the active layer is dissipated through the substrate. However, the laser chip package 120 of the present invention has a relatively short heat dissipating path from the active layer 125 to the submount 122, to dissipate heat more efficiently.

The laser chip package 120 of the present invention may further include package blocks 121a and 121b that are attached respectively to the submount 122 and the laser chip 123 to protect the laser chip 123 and facilitate heat dissipation from the active layer 123 to the outside. The package blocks 121a and 121b are formed of metal having a high thermal conductivity. Generally, copper (Cu) is used for the package blocks 121a and 121b. However, the metal package blocks 121a and 121b do not transmit light. Therefore, the package block 121a attached to the bottom surface of the submount 122 has an opening 128 to allow the second wavelength pump light emitted from the pump laser 150 to reach the laser chip 123. For the same reason, the package block 121b attached to the top surface of the laser chip 123 also has an opening 129 to allow the first wavelength light emitted from the laser chip 123 to advance to the external mirror 140.

Figure 4:
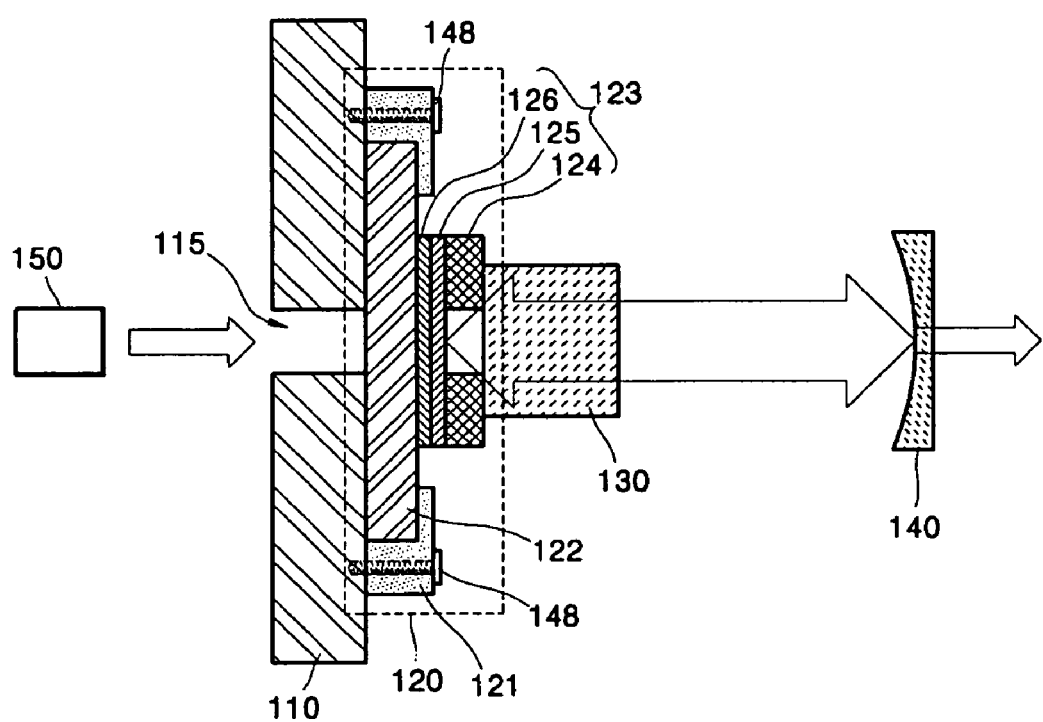
FIG. 4 is a sectional view of an end-pumped VECSEL according to a second embodiment of the present invention.

FIG. 4 is a sectional view of an end-pumped VECSEL according to a second embodiment of the present invention. In the first embodiment shown in FIGS. 2 and 3, the laser chip 123 can be damaged by compression when attaching the package blocks 121a and 121b to the laser chip 123. In the second embodiment shown in FIG. 4, the laser chip package 120 is constructed to minimize the possibility of damage to the laser chip 123 during the package block attachment.

In detail, according to the structure of a laser chip package 120 of a VECSEL of the second embodiment of the present invention, as shown in FIG. 4, a laser chip 123 is mounted on the top center surface of a submount 122, and a package block 121 is coupled to partially enclose a lateral surface and a top edge of the submount 122. The package block 121 is fixed to a heat sink 110 using fasteners 148 such as screws. The laser chip 123, as described above, includes a substrate 124, an active layer 125 formed on the substrate 124, and a DBR layer 126 formed on the active layer 125. The laser chip 123 is mounted on the submount 122 with the substrate facing the external mirror 140 and the DBR layer 126 contacting the submount 122. The substrate 124 has an opening to allow light emitted from the active layer 125 to advance to the external mirror 140. According to this structure, the package block 121 does not contact the laser chip 123, but contacts the submount 122, eliminating the possibility of damage to the laser chip 123 when attaching the package block 121. Further, since the submount 122 can be fixed to the heat sink 110 with the single package block 121, the VECSEL can have a simple structure and can be manufactured quickly and cheaply.

The VECSEL of the second embodiment shown in FIG. 4 has the same structure as the VECSEL of the first embodiment except for the laser chip package 120. As shown in FIG. 4, the VECSEL of the second embodiment includes the laser chip package 120 having the laser chip 123 to emit the first wavelength light, the external mirror 140 spaced apart from one side of the laser chip package 120, a pump laser 150 emitting pump light at a second wavelength to the other side of the laser chip package 120, and the heat sink 110 attached to the other side of the laser chip package 120 to dissipate heat generated by the laser chip package 120. The heat sink 110, for example, is formed of high thermal conductive material such as copper (Cu), and has an opening 115 to allow the pump light emitted from the pump laser 150 to reach the laser chip package 120. Further, an SHG crystal 130 may be located between the laser chip package 120 and the external mirror 140 to double the frequency of the first wavelength light emitted from the laser chip package 120.

Figure 5:
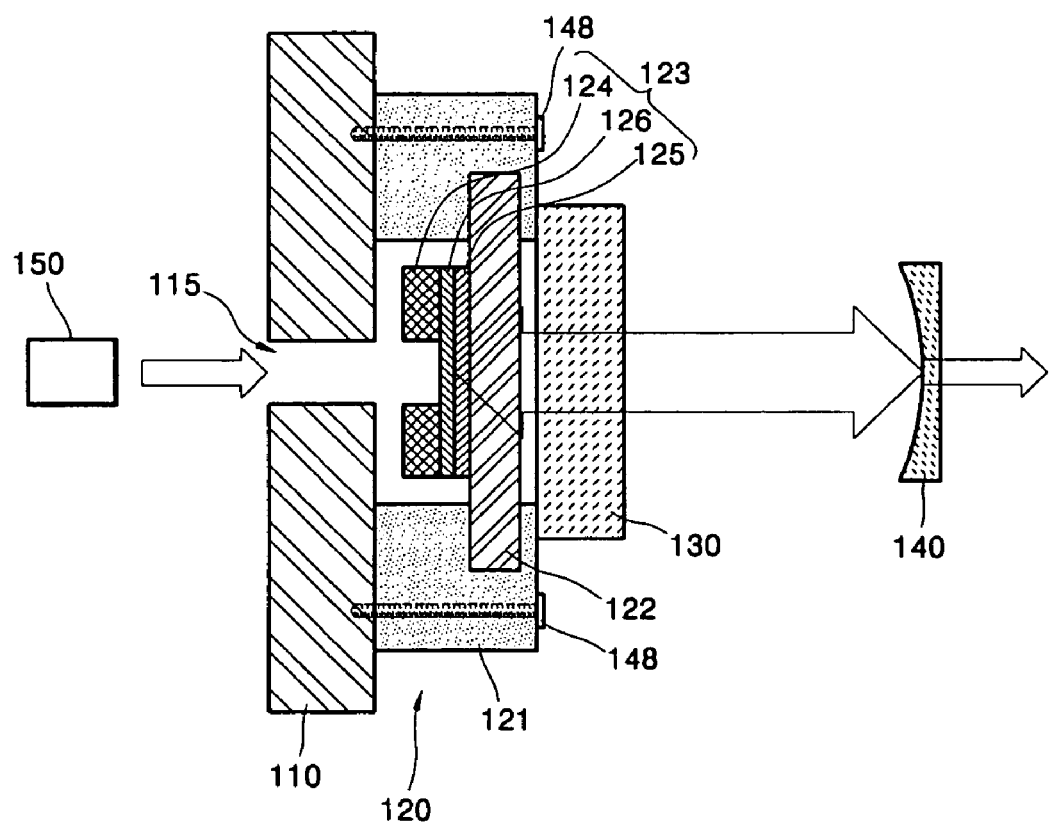
FIG. 5 is a sectional view of an end-pumped VECSEL according to a third embodiment of the present invention.

FIG. 5 is a sectional view of an end-pumped VECSEL according to a third embodiment of the present invention. The VECSEL of the third embodiment shown in FIG. 5 has the same structure as the VECSEL of the first embodiment, except for the laser chip package.

The structure of the laser chip package 120 of the VECSEL of the third embodiment will now be described more fully with reference to FIG. 5. A submount 122 faces the external mirror 140, and a laser chip 123 faces a pump laser 150. A package block 121 is fixed to a heat sink 110 to enclose portions of the top and bottom edges of the submount 122. The package block 121, for example, is fixed to the heat sink 110 using fasteners 148 such as screws. Further, in the third embodiment, a laser chip 123 includes a substrate 124, a DBR layer 126 formed on the substrate 124, and an active layer 125 formed on the DBR layer 126. The laser chip 123 is attached to the submount 122 with the substrate 124 facing the pump laser 150 and the active layer 125 contacting the submount 122. The substrate 124 has a central opening to allow light emitted from the pump laser 150 to advance to the active layer 125. The submount 122 has a high thermal conductivity, as well as a high optical transmittance to transmit light emitted from the active layer 125. Preferably, as described above, the submount 122 is formed of diamond. Alternatively, the submount 122 can be formed of other materials such as SiC, AlN, and GaN. According to this structure of the laser chip package 120, the laser chip 123 is not exposed to the outside. Therefore, the possibility of damage to the laser chip 123 can be significantly decreased.

As described above, according to the structure of the laser chip package 120 of the present invention, light is transmitted through an interface between the submount 122 and the laser chip 123. That is, light emitted from the pump laser 150 passes through the submount 122 to the laser chip 123 in the first and second embodiments, and light emitted from the laser chip 123 passes through the submount 122 to the external mirror 140 in the third embodiment. Therefore, if adhesive is applied to the contact surface between the laser chip 123 and the submount 122 to fix the laser chip 123 to the submount 122, light transmission can be reduced by obstructions. To prevent the light loss between the laser chip 123 and the submount 122, a bonding method such as a capillary bonding can be used to couple the laser chip 123 to the submount 122.

Figure 6A:
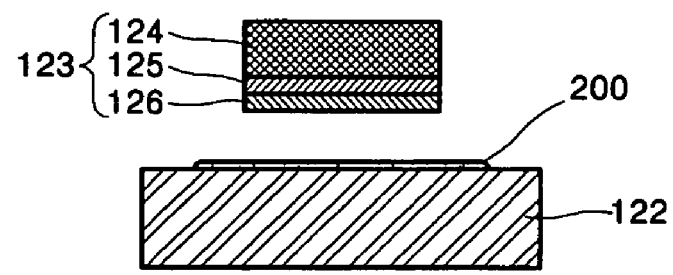
FIGS. 6A through 6C show an assembly process of a laser chip and a submount.
Figure 6B:
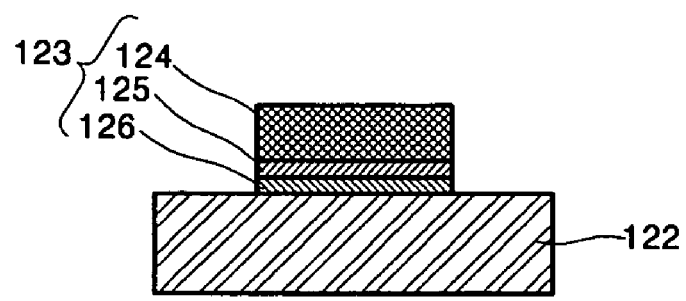
Figure 6C:
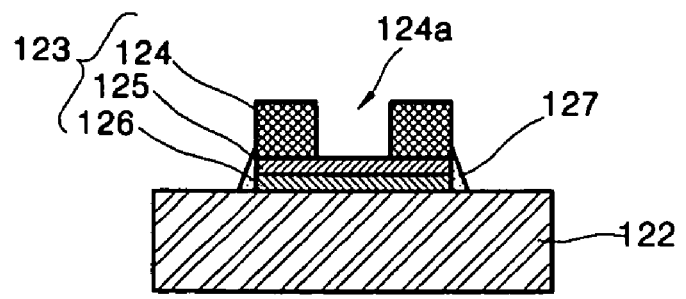

FIGS. 6A to 6C show an assembly process of the laser chip 123 and the submount 122 using capillary bonding. First, referring to FIG. 6A, a volatile liquid material 200 is applied to the top surface of the submount 122. For example, the volatile liquid material 200 may be methanol or deionized (DI) water.

Next, referring to FIG. 6B, the laser chip 123 is placed on the top surface of the submount 122 where the liquid material 200 is applied. Here, the DBR layer 126 of the laser chip 123 faces the top surface of the submount 122 in the first and second embodiments, and an active layer 125 of the laser chip 123 faces the top surface of the submount 122 in the third embodiment. For convenience of description, FIGS. 6A through 6C show the assembly process of the laser chip 123 and the submount 122 according to the first and second embodiments, but the assembly process shown in FIGS. 6A through 6C can be applied to the third embodiment in the same way. When the laser chip 123 placed on the top surface of the submount 122 is depressed, most of the liquid material 200 drains away from between the laser chip 123 and the submount 122. This also completely removes air, so that no air layer exists between the laser chip 123 and the submount 122.

Therefore, after the remaining liquid material 200 is completely volatilized, the submount 122 and the laser chip 123 can make tight contact with each other at a distance of several nanometers or less. Since the Van Der Waals attraction force acts on two closely adjoining objects such as these, the submount 122 and the laser chip 123 can be coupled without separation. When the laser chip 123 and the submount 122 are coupled by capillary bonding, substantially no optical loss occurs at the interface between submount 122 and the laser chip 123.

After the laser chip 123 and the submount 122 are coupled by capillary bonding, referring to FIG. 6C, resin 127 can be applied to the lower edge of the laser chip 123 to fix the laser chip 123 to the submount 122 more securely. For example, a UV-hardening resin can be applied and cured by UV rays, to fix the laser chip 123 to the submount 122 more securely. Then, referring again to FIG. 6C, the substrate 124 of the laser chip 123 is etched to define an opening 124a at its center portion to allow light emitted from the laser chip 123 at the first wavelength to advance to an external mirror without loss.

Figure 7A:
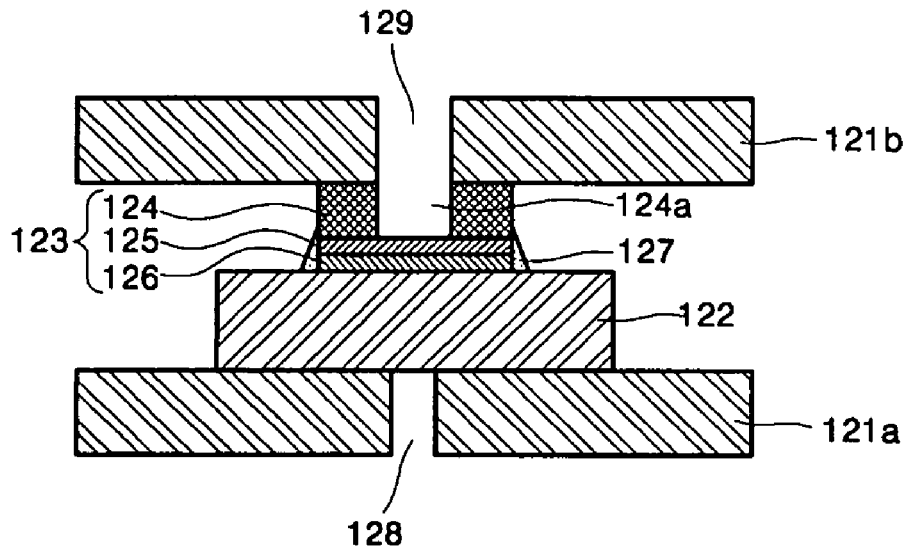
FIGS. 7A and 7B are a sectional view and a perspective view, showing a package block of the first embodiment coupled to the assembly of the laser chip and the submount assembled through the process shown in FIG. 6A through 6C.

After the assembly of the laser chip 123 and the submount 122, referring to FIG. 7A, package blocks 121a and 121b are attached respectively to the bottom surface of the submount 122 and the top surface of the laser chip 123.

Figure 7B:
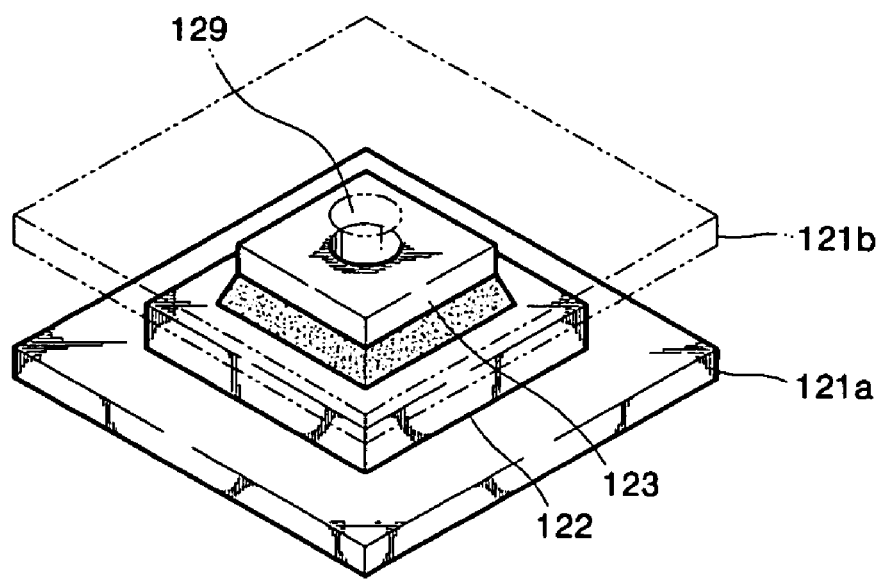

FIG. 7B is a perspective view of the laser chip package 120 of the first embodiment, fabricated according to the aforementioned process. The laser chip package 120 may have a relatively small size, with a width of about 10 mm and a height of about 7 mm. Further, the opening 124a in the substrate 124 and an opening 129 in the package block 121b above the laser chip 123 may have a diameter of about 3 mm. In the VECSEL of the present invention, an active layer 125 emits a light beam with a cross-sectional diameter of 100 μm to 300 μm. Therefore, it is sufficient for the openings 124a and 129 to have a 3 mm diameter.

Figure 8A:
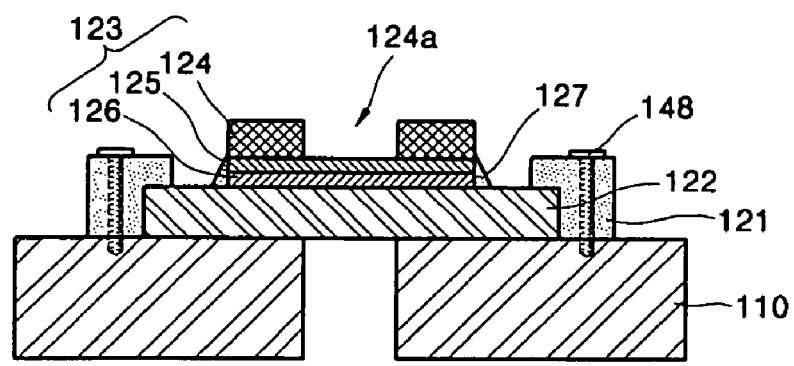
FIGS. 8A and 8B are a sectional view and a perspective view, showing a package block of the second embodiment coupled to the assembly of the laser chip and the submount assembled through the process shown in FIG. 6A through 6C.
Figure 8B:
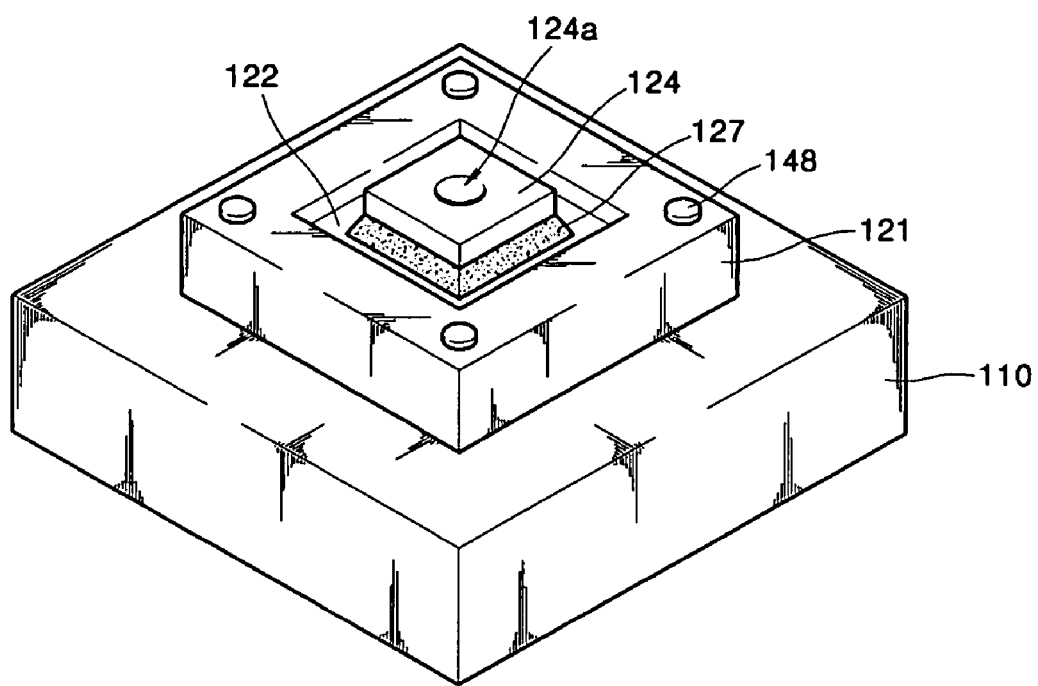

Further, referring to FIG. 8A, after the package block 121 is put on the submount 122 on which a laser chip 123 is mounted, the fasteners 148 such as screws are used to mount the package block 121 on the heat sink 110 so that the laser chip package 120 of the second embodiment can be fabricated. FIG. 8B is a perspective view of the laser chip package 120 mounted on the heat sink 110 in this way.

Figure 9:
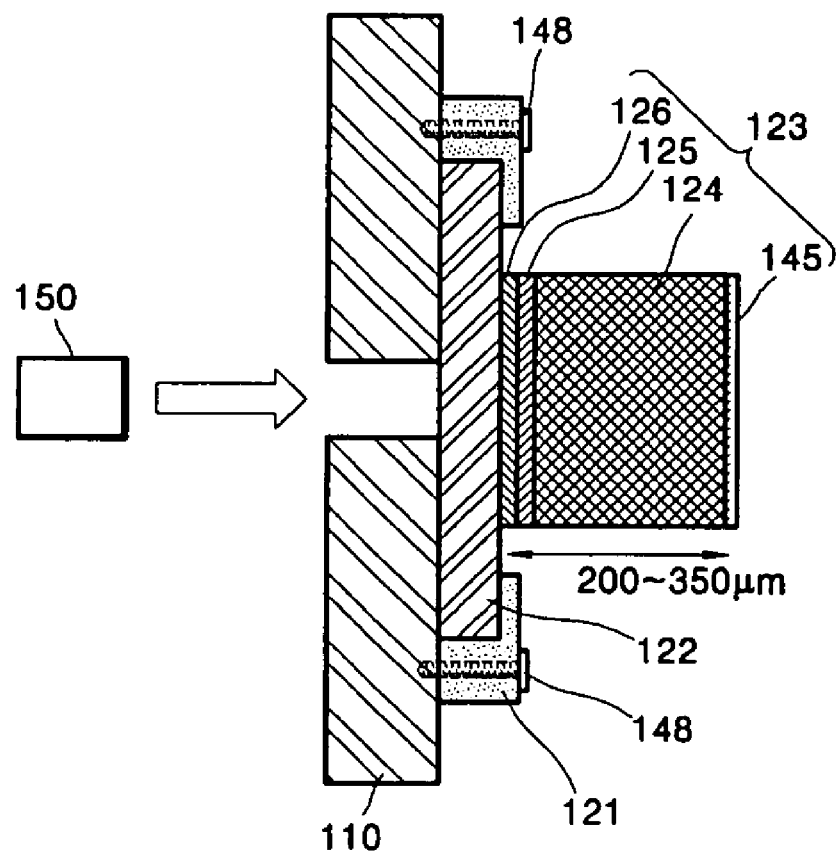
FIG. 9 is a sectional view of an end-pumped VECSEL according to a fourth embodiment of the present invention.

FIG. 9 is a sectional view of an end-pumped VECSEL according to a fourth embodiment of the present invention. The fourth embodiment is obtained by slightly modifying only the structure of the laser chip 123 in the second embodiment shown in FIG. 4, and the remaining components are the same as those in the second embodiment. For convenience's sake, a second harmonic generation (SHG) crystal and an external mirror are not shown in FIG. 9. In the first through third embodiments, the substrate 124 of the laser chip 123 is etched to define the opening 124a at its center portion. The etching process extends the manufacture of the laser chip 123 and increases the manufacturing time. Furthermore, since resonance also occurs within the laser chip 123, the quantum well structure of the active layer 125 should be formed in accordance with the characteristics of the resonance within the laser chip 123, and the thickness of the substrate 124 should be accurately etched. Thus, the etching of the substrate 124 requires particularly a long period of time.

However, even when the substrate 124 is etched to an exact thickness, it is prone to be deformed, for example, thermally expanded, during an operation of the laser chip 123 due to a decrease in the entire thickness of the laser chip 123. When this deformation occurs, the resonance conditions are changed, and laser light with a very unstable spectrum may be possibly emitted.

The laser chip 123 in the fourth embodiment includes a substrate 124 that is not etched and is rather thicker than that in a conventional art in contrast with FIG. 4. An anti-reflection (AR) coating layer 145 is formed on the upper surface of the substrate 124. To increase the transmittance at the wavelength of 900 nm or greater, an N$^+$-doped GaAs substrate may be used as the substrate 124. The overall thickness of the laser chip 123 including the DBR layer 126, the active layer 125, the substrate 124, and the AR coating layer 145 is suitably about 200-350 μm. The sum of the thicknesses of the DBR layer 126 and the active layer 125 is about 7 μm.

In the fourth embodiment, since the AR coating layer 145 is formed on the upper surface of the substrate 124, no resonance occurs within the laser chip 123, and resonance occurs only between the DBR layer 126 and the external mirror 140 of FIGS. 4 and 5. Hence, the resonance within the laser chip 123 needs not to be considered when forming the quantum well structure of the active layer 125. Since the substrate 124 needs not to be etched, the manufacturing time and costs of the laser chip 123 can be greatly decreased. In addition, since the substrate 124 is very thick, it is not easily deformed by heat during the operation of the laser chip 123, so that laser light having a very stable spectrum can be obtained. Furthermore, since the substrate 124 is very transparent in spite of being thick, light loss is small.

Although the fourth embodiment shown in FIG. 9 is illustrated as a modification of the second embodiment in which the laser chip 123 is slightly changed, the laser chips 123 in the first through third embodiments may also be modified to have the same structure of the laser chip 123 in the fourth embodiment.

Figure 1:
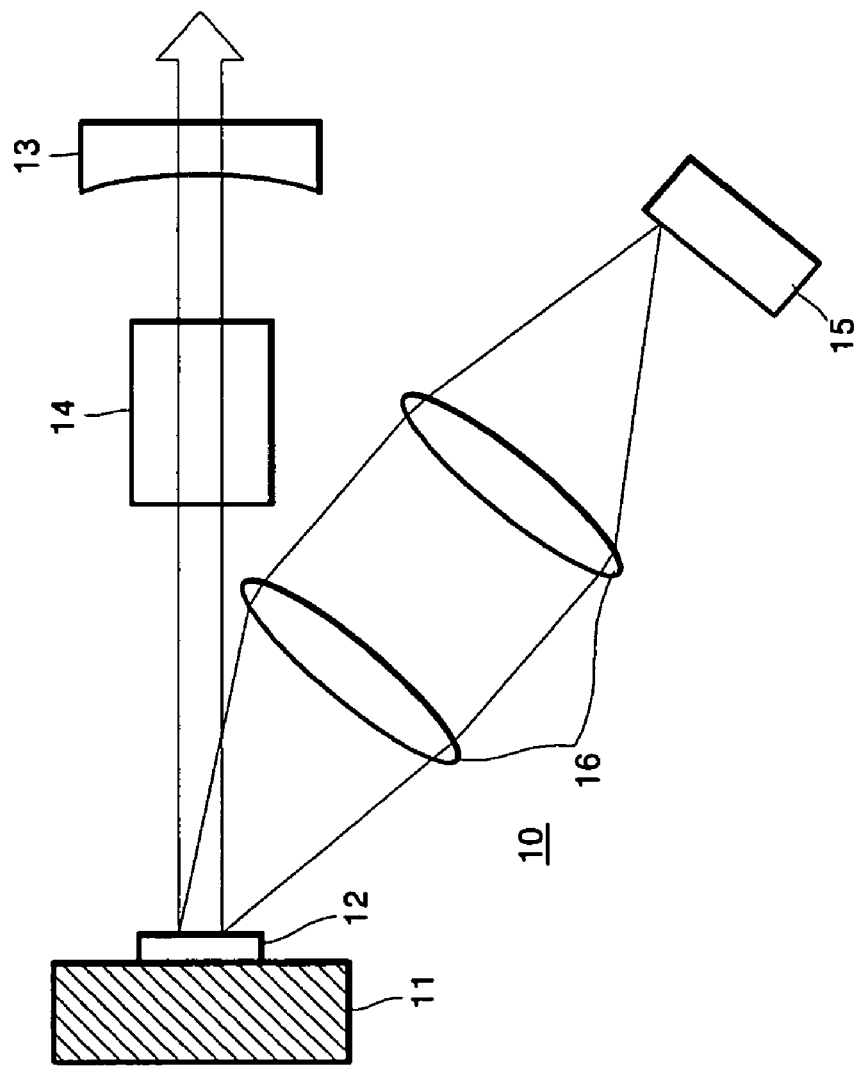
FIG. 1 is a sectional view of an optical pumped VECSEL according to the related art.
Figure 10:
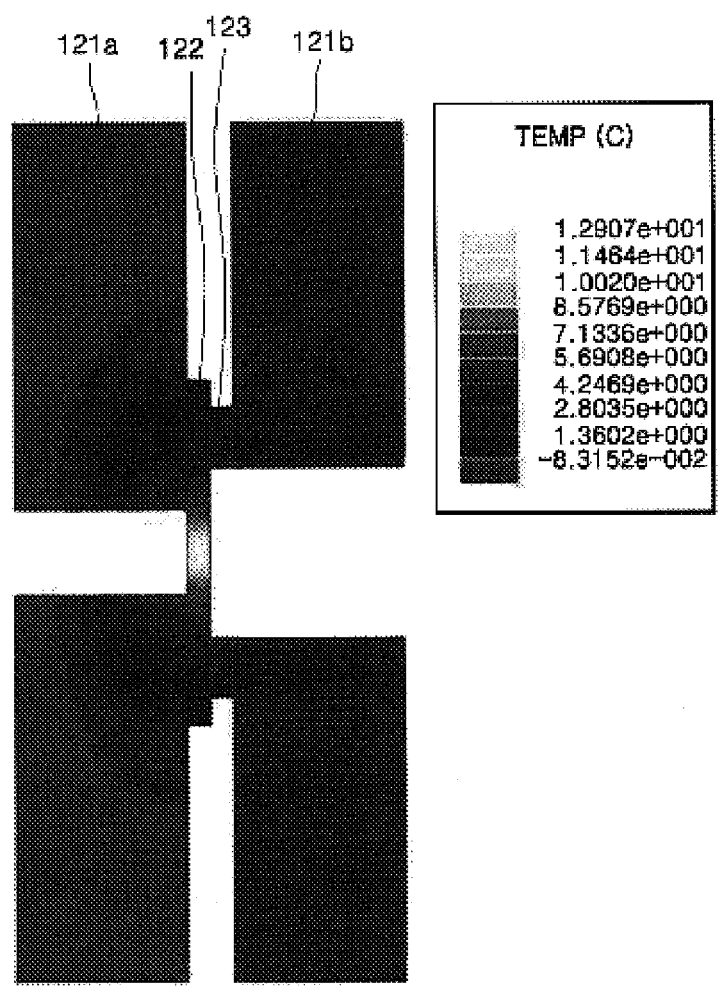
FIG. 10 shows a simulation of heat distribution during the operation of a laser chip package according to the present invention.

FIG. 10 shows a simulation of heat distribution during the operation of the laser chip package 120 of the first embodiment of the present invention. As described above, light emitted from the pump laser 150 is projected onto the laser chip 123 through the submount 122. Then, optical pumping occurs in the laser chip 123, and at the same time, heat is generated by the laser chip 123. The heat is dissipated through the submount 122 and the package blocks 121a and 121b. In the conventional VECSEL shown in FIG. 1, pump light is incident on the top surface of the laser chip and heat is dissipated from the bottom. Therefore, the conventional VECSEL has a low heat discharging efficiency. However, according to the present invention, heat dissipating starts from the portion where the pump light is incident. Therefore, the VECSEL of the present invention has a high heat dissipating efficiency compared with the conventional VECSEL. Referring to FIG. 10, heat generated by the laser chip 123 is rapidly dissipated as the heat is transferred to the submount 122 and the package blocks 121a and 121b.

Figure 11:
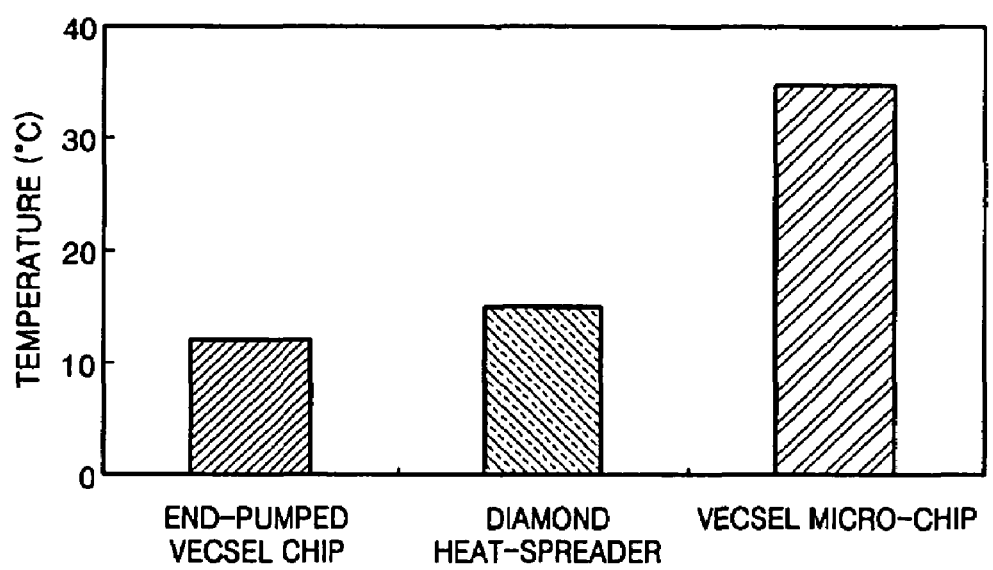
FIG. 11 is a graph comparing the temperature of a laser chip of the present invention with the temperature of a laser chip of the related art.

FIG. 11 is a graph of the temperature of the laser chip 123 of the first embodiment of the present invention is compared with the temperature of the laser chip of the conventional VECSEL, clearly showing the difference in heat dissipating efficiency. In FIG. 11, the rightmost bar indicates the temperature of the laser chip 12 of the conventional VECSEL 10, and the center bar indicates the temperature of the heat sink 11 formed of diamond in the conventional VECSEL 10. The leftmost bar indicates the temperature of the laser chip 123 of the VECSEL 100 of the first embodiment of the present invention. As shown in FIG. 11, the temperature of the laser chip 123 of the first embodiment is lower than that of the heat sink 11 of the conventional VECSEL 10. Therefore, it can be understood that the structure of the VECSEL 100 of the present invention has a superior heat dissipating efficiency.

Figure 12A:
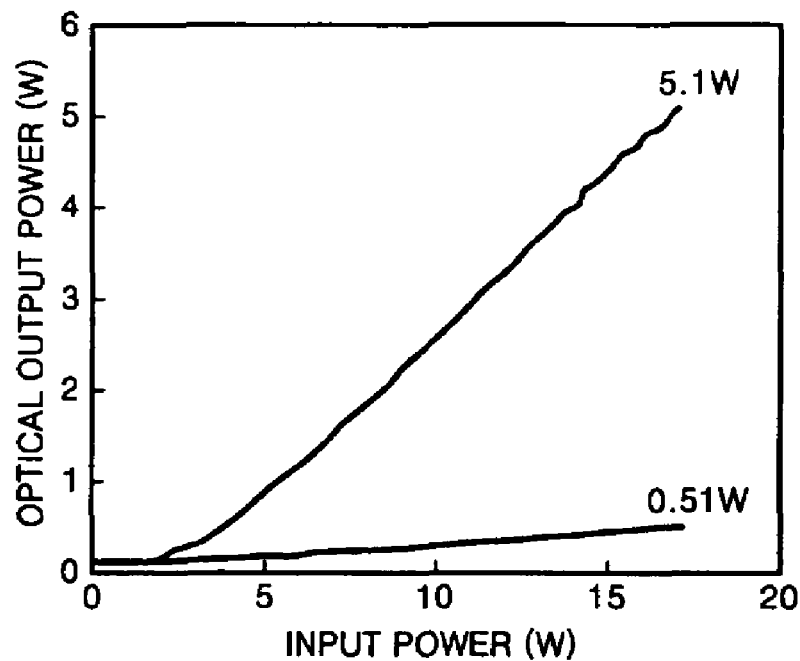
FIGS. 12A and 12B are performance graphs of a VECSEL of the related art and a VECSEL of the present invention.
Figure 12B:
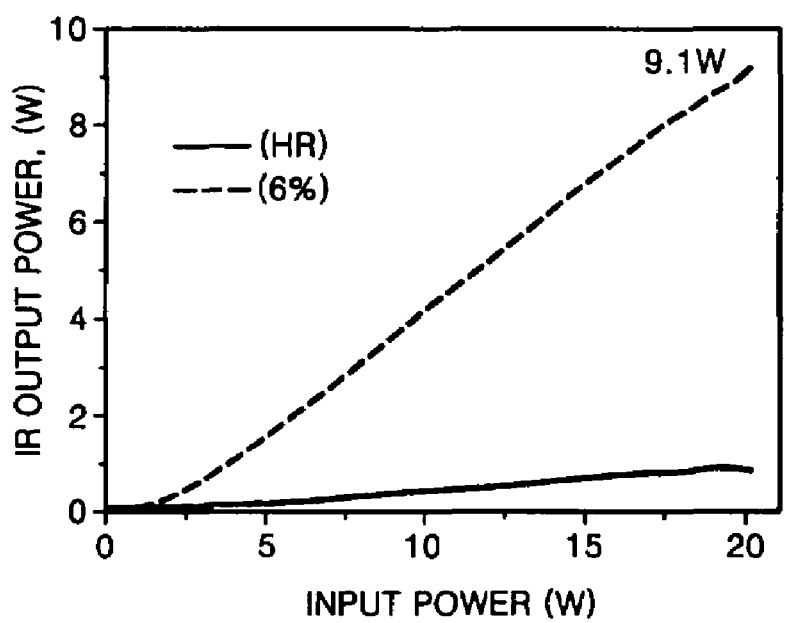

FIGS. 12A and 12B are performance graphs of the conventional VECSEL and a VECSEL of the present invention, respectively. Cavities of the conventional VECSEL and the VECSEL of the present invention have the same length of 140 mm. First, referring to FIG. 11A showing the performance of the conventional VECSEL, if a mirror with a reflectance of 94% is used for the external mirror, an output power of about 5.1 Watts can be obtained, and if a high reflection (HR) mirror with a reflectance of almost 100% is used for the external mirror, an output power of about 0.51 Watts can be obtained. On the other hand, referring to FIG. 11B, if a mirror with a reflectance of 94% (i.e., transmittance of 6%) is used for the external mirror, a high output power, namely, about 9.1 Watts, can be obtained, and if a high reflection (HR) mirror with a reflectance of almost 100% is used for the external mirror, an output power of about 1.37 Watts can be obtained. Therefore, it can be understood that the VECSEL of the present invention has a significantly improved output power compared with the conventional VECSEL.

As described above, according to the VECSEL of the embodiments of the present invention, the pump laser is aligned with the heat sink from the back of the heat sink instead of being located on one side at an angle, so that the VECSEL can be mass produced through a simple manufacturing process and the size of the VECSEL can be reduced.

Further, the SHG crystal can be closer to the laser chip, so that the optical wavelength converting efficiency of the SHG crystal can be increased.

Furthermore, according to the present invention, the pump laser beam is incident on the laser chip at a right angle to prevent reflection loss and dispersion of the pump laser beam. Therefore, the optical output of the laser chip can be increased and the cross section of the light beam emitted from the laser chip can be maintained in an approximately circular configuration.

In addition, the heat discharging structure of the VECSEL of the present invention is designed such that heat conduction starts from the portion of the laser chip where the pump laser beam is incident. Therefore, the laser chip can be cooled more efficiently than the conventional laser chip.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. An external cavity surface emitting laser comprising:
   a laser chip package provided with a laser chip emitting light at a first wavelength by optical pumping;
   an external mirror spaced apart from a top surface of the laser chip package to transmit a portion of the light emitted from the laser chip to the outside and to reflect the remainder of the light to the laser chip;
   a heat sink coupled to a bottom surface of the laser chip package to dissipate heat generated by the laser chip; and
   a pump laser facing a bottom surface of the heat sink to emit pump light at a second wavelength substantially perpendicular to the laser chip,
   wherein the laser chip package includes:
      a thermally conductive and transparent submount; and
      the laser chip attached to the submount to emit the first wavelength light to the external mirror,
   wherein the submount transfers the heat generated by the laser chip toward the heat sink, and
   wherein the laser chip includes:
      a substrate;
      an active layer having a quantum well structure formed on the substrate, the active layer being activated by the pump light emitted from the pump laser to emit the first wavelength light; and
      a DBR (distributed Bragg reflector) layer formed on the active layer to reflect the first wavelength light emitted from the active layer to the external mirror and to transmit the second wavelength pump light emitted from the pump laser.

2. The external cavity surface emitting laser of claim 1, wherein the heat sink has a central opening to allow the pump light emitted from the pump laser to reach the laser chip package.

3. The external cavity surface emitting laser of claim 1, wherein the thermal conductive and transparent submount is located on a top surface of the heat sink, and wherein the submount transfers heat generated by the laser chip to the heat sink and transmits the pump light emitted from the pump laser.

4. The external cavity surface emitting laser of claim 1, wherein the submount is formed of at least one material selected from the group consisting of diamond, silicon carbide (SiC), aluminum nitride (AlN), and gallium nitride (GaN).

5. The external cavity surface emitting laser of claim 1, further comprising a capillary bonding layer between the laser chip and the submount.

6. The external cavity surface emitting laser of claim 5, further comprising a curable resin located around the top surface of the submount where the laser chip is attached and around an outer surface of the laser chip.

7. The external cavity surface emitting laser of claim 1, wherein the substrate of the laser chip faces the external mirror and the DBR layer of the laser chip contacts the top surface of the submount.

8. The external cavity surface emitting laser of claim 7, wherein the substrate has a central opening to allow the light emitted from the active layer of the laser chip to advance to the external mirror.

9. The external cavity surface emitting laser of claim 1, further comprising an anti-reflection coating layer on a surface of the substrate opposite to the active layer.

10. The external cavity surface emitting laser of claim 1, wherein the laser chip package further includes first and second heat conductive package blocks attached respectively between the heat sink and the submount and to a top surface of the laser chip.

11. The external cavity surface emitting laser of claim 10, wherein the first and second package blocks each have a central opening, to respectively allow the first wavelength light emitted from the laser chip to advance to the external mirror and allow the second wave length light emitted from the pump laser to reach the laser chip.

12. The external cavity surface emitting laser of claim 1, wherein the laser chip package further includes a package block partially enclosing a lateral surface and a top edge of the submount and fixed to the heat sink.

13. The external cavity surface emitting laser of claim 1, wherein an SHG (second harmonic generation) crystal is located between the laser chip package and the external mirror to double the frequency of the first wavelength light emitted from the laser chip package.

14. The external cavity surface emitting laser of claim 13, wherein the SHG crystal contacts the laser chip package.

15. The external cavity surface emitting laser of claim 1, wherein the thermal conductive and transparent submount faces a top surface of the heat sink, and wherein the submount transfers the heat generated by the laser chip to the heat sink and transmits the first wavelength light emitted from the laser chip.

16. The external cavity surface emitting laser of claim 15, wherein the submount is formed of at least one material selected from the group consisting of diamond, silicon carbide (SiC), aluminum nitride (AlN), and gallium nitride (GaN).

17. The external cavity surface emitting laser of claim 15, further comprising a capillary bonding layer between the laser chip and the submount.

18. The external cavity surface emitting laser of claim 17, further comprising a curable resin located around the top surface of the submount where the laser chip is attached and around an outer surface of the laser chip.

19. The external cavity surface emitting laser of claim 1, wherein the substrate of the laser chip faces the heat sink and the active layer of the laser chip contacts the bottom surface of the submount.

20. The external cavity surface emitting laser of claim 19, wherein the substrate has a central opening to allow the pump light emitted from the pump laser to advance to the active layer of the laser chip.

21. The external cavity surface emitting laser of claim 1, further comprising an anti-reflection coating layer located on a surface of the substrate opposite to the DBR layer.

22. The external cavity surface emitting laser of claim 15, wherein the laser chip package further includes a package block partially enclosing a top edge and a bottom edge of the submount and fixed to the heat sink.

23. The external cavity surface emitting laser of claim 15, wherein an SHG crystal is located between the laser chip package and the external mirror to double the frequency of the first wavelength light emitted from the laser chip package.

24. The external cavity surface emitting laser of claim 23, wherein the SHG crystal contacts the laser chip package.

25. The external cavity surface emitting laser of claim 1, wherein:

a bottom surface of the DBR layer is formed on a top surface of the submount, a bottom surface of the active layer is formed on a top surface of the DBR layer, and a bottom surface of the substrate is formed on a top surface of the active layer; and the pump laser is configured to emit the pump light at the second wavelength substantially perpendicular to the bottom surface of the submount.

* * * * *